(12) United States Patent
Xue et al.

(10) Patent No.: US 9,798,192 B2
(45) Date of Patent: Oct. 24, 2017

(54) DISPLAY SUBSTRATE AND MANUFACTURING METHOD THEREOF, DISPLAY PANEL AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Hongwei Xue, Beijing (CN); Lindong Chen, Beijing (CN); Yi Kong, Beijing (CN); Lizhi Guan, Beijing (CN); Junhao Liu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/785,787

(22) PCT Filed: Mar. 27, 2015

(86) PCT No.: PCT/CN2015/075207
§ 371 (c)(1),
(2) Date: Oct. 20, 2015

(87) PCT Pub. No.: WO2016/074413
PCT Pub. Date: May 19, 2016

(65) Prior Publication Data
US 2016/0342031 A1 Nov. 24, 2016

(30) Foreign Application Priority Data
Nov. 14, 2014 (CN) .......................... 2014 1 0650620

(51) Int. Cl.
*G02F 1/1337* (2006.01)
*G02F 1/1343* (2006.01)
(Continued)

(52) U.S. Cl.
CPC ...... *G02F 1/133784* (2013.01); *G02F 1/1339* (2013.01); *G02F 1/1368* (2013.01);
(Continued)

(58) Field of Classification Search
CPC . G02F 1/133351; G02F 1/1337; G02F 1/1368
(Continued)

(56) References Cited

U.S. PATENT DOCUMENTS 7,710,530 B2 5/2010 Tsubata
8,593,600 B2 * 11/2013 Jeong ................ G02F 1/133351
349/123

(Continued)

FOREIGN PATENT DOCUMENTS

CN 202512326 U 10/2012
CN 202794786 U 3/2013
(Continued)

OTHER PUBLICATIONS

International Search Report & Written Opinion Appln. No. PCT/CN2015/075207; Dated Jul. 31, 2015.
(Continued)

*Primary Examiner* — Jonathan Han
(74) *Attorney, Agent, or Firm* — Ladas & Parry LLP; Loren K. Thompson

(57) ABSTRACT

A display substrate, a manufacturing method thereof, a display panel and a display device are provided. The display substrate includes a display region and a non-display region. A reset zone is provided in the non-display region, and a thickness of a thin film layer provided in the reset zone is smaller than a thickness of a thin film layer provided in a
(Continued)

zone adjacent to the reset zone. A step between the thin film layer in the reset zone and the thin film layer in the zone adjacent to the reset zone at the boundary of the reset zone and the zone adjacent to the reset zone is uniform in height; and in a direction within a surface of the display substrate and perpendicular to a rubbing direction of the display substrate, a size of the reset zone is greater than or equal to a size of the display region.

16 Claims, 4 Drawing Sheets

(51) Int. Cl.
| | | |
|---|---|---|
| H01L 27/12 | (2006.01) | |
| G02F 1/1362 | (2006.01) | |
| G02F 1/1335 | (2006.01) | |
| G02F 1/1339 | (2006.01) | |
| G02F 1/1368 | (2006.01) | |
| G02F 1/1345 | (2006.01) | |
| G02F 1/1333 | (2006.01) | |

(52) U.S. Cl.
CPC .. *G02F 1/133514* (2013.01); *G02F 1/134309* (2013.01); *G02F 1/136286* (2013.01); *H01L 27/1244* (2013.01); *H01L 27/1288* (2013.01); *G02F 1/13454* (2013.01); *G02F 2001/133388* (2013.01); *G02F 2001/136295* (2013.01); *G02F 2201/123* (2013.01)

(58) Field of Classification Search
USPC .......... 349/106, 139; 257/E21.412; 345/206; 438/155, 34
See application file for complete search history.

(56) References Cited

U.S. PATENT DOCUMENTS

| | | | | |
|---|---|---|---|---|
| 2009/0174695 | A1* | 7/2009 | Nojiri | ................. G02F 1/13454 345/206 |
| 2009/0294781 | A1* | 12/2009 | Kim | .................... H01L 27/1288 257/88 |
| 2010/0289992 | A1* | 11/2010 | Nojiri | ............... G02F 1/133512 349/106 |
| 2015/0253596 | A1 | 9/2015 | Zhang et al. | |

FOREIGN PATENT DOCUMENTS

| | | |
|---|---|---|
| CN | 103869546 A | 6/2014 |
| CN | 203630483 U | 6/2014 |
| CN | 104330911 A | 2/2015 |
| JP | 2001-318380 A | 11/2001 |
| KR | 20080057784 A | 6/2008 |

OTHER PUBLICATIONS

First Chinese Office Action dated Aug. 18, 2016; Appln. No. 201410650620.X.
Second Chinese Office Action dated Jan. 26, 2017; Appln. No. 201410650620.X.
The Third Chinese Office Action dated Jul. 14, 2017; Appln. No. 201410650620.X.

* cited by examiner

DISPLAY SUBSTRATE AND MANUFACTURING METHOD THEREOF, DISPLAY PANEL AND DISPLAY DEVICE

TECHNICAL FIELD

Embodiments of the present disclosure relate to a display substrate and a manufacturing method thereof, a display panel and a display device.

BACKGROUND

Thin Film Transistor Liquid Crystal Displays (TFT-LCDs) as a kind of flat panel display devices are more and more applied in the field of high performance display because they have advantages of small volume, low power consumption, radiation-free, relatively low production cost, etc.

A TFT-LCD comprises an array substrate and a color filter substrate. A liquid crystal layer is provided between the array substrate and the color filter substrate, the intensity of light passing though the liquid crystal layer is controlled by means of controlling deflection of liquid crystal molecules, and then, color image display is realized with the aid of filter action of the color filter substrate. For the sake of realizing the effective control of deflected liquid crystal molecules, it is necessary to provide alignment layers on the array substrate and the color filter substrate, respectively, and then to fabricate alignment grooves in a same direction at a surface of each alignment layer by a rubbing process, so that liquid crystal molecules situated in the alignment grooves are aligned in the same direction.

As there is a step on the array substrate and/or the color filter substrate in the rubbing direction, different deformed zones are generated at a surface of a rubbing cloth on a rubbing roller. In addition, because frictional strengths of different deformed zones are non-uniform, alignment grooves fabricated during the rubbing process are non-uniform in depth. Accordingly, an undesirable phenomenon with lump grayscale non-uniformity caused by the above defects in alignment (referred as Rubbing Mura) occurs during display.

In addition, in order to take control of the image display of the display panel of TFT-LCD, a driving IC (Integrated Circuit) is required to be bonded to a bonding region of the display panel. Generally, during such bonding process, a via hole needs to be provided at the bonding region of the display panel, so that a lead wire in the bonding region is connected to a gate line or a data line in a display region, and then control signals output from the driving IC are input to the data line and the gate line.

Because some thin film layers at the via hole are removed, there is a step between the via hole and its surrounding region. As a result, the planarity of the surface to be rubbed is degraded; and then, during the alignment process, the alignment grooves are fabricated to be non-uniform in depth, giving rising to generation of Rubbing Mura. Thus, display effects of the display panel and quality of products are greatly reduced.

SUMMARY

According to at least an embodiment of the disclosure, there is provided a display substrate, and the display substrate includes a display region and a non-display region. A reset zone is provided in the non-display region, and a thickness of a thin film layer provided in the reset zone is smaller than a thickness of a thin film layer provided in a zone adjacent to the reset zone. A step between the thin film layer in the reset zone and the thin film layer in the zone adjacent to the reset zone at the boundary of the reset zone and the zone adjacent to the reset zone is uniform in height; and in a direction within a surface of the display substrate and perpendicular to a rubbing direction of the display substrate, a size of the reset zone is greater than or equal to a size of the display region.

For example, the display substrate is an array substrate or a color filter substrate.

For example, in the case that the display substrate is an array substrate and in the case that a bonding zone is provided within the reset zone, a protective layer is provided within the reset zone and the protective layer covers other areas than the bonding zone.

For example, in the case that a lead wire of the bonding zone is formed in a same layer and with a same material as a gate line of the display region, the protective layer comprises a gate insulating layer.

For example, in the case that the display substrate is an array substrate and in the case that an organic thin film layer is provided on a surface of a source/drain metal layer of the array substrate, the organic thin film layer covers other areas than the reset zone.

For example, in the case that the display substrate is an array substrate, the reset zone corresponds to a location of a sealant located on a surface of the array substrate.

According to at least an embodiment of the disclosure, there is further provided a display panel, and the display panel includes any one of the display substrates as stated above.

According to at least an embodiment of the disclosure, there is further provided a display device, and the display device includes the display panel as stated above.

According to at least an embodiment of the disclosure, there is further provided a manufacturing method of a display panel. The method includes: forming a display region on a base substrate; and forming a non-display region on the base substrate. A reset zone is formed in the non-display region, a thickness of a thin film layer provided in the reset zone is smaller than a thickness of a thin film layer provided in a zone adjacent to the reset zone; a step between the thin film layer in the reset zone and the thin film layer in the zone adjacent to the reset zone at the boundary of the reset zone and the zone adjacent to the reset zone is uniform in height; and in a direction within a surface of the display substrate and perpendicular to a rubbing direction of the display substrate, a size of the reset zone is greater than or equal to a size of the display region.

For example, in the case that the display substrate is an array substrate and in the case that a bonding zone is provided within the reset zone, the method comprises: forming a protective layer in areas other than the bonding zone in the reset zone.

For example, in the case that a lead wire of the bonding zone is formed in a same layer and with a same material as a gate line of the display region, the method comprises: sequentially forming a gate insulating layer, a semiconductor active layer, a source/drain metal layer and a passivation layer on a surface of the lead wire, and coating a photoresist on a surface of the passivation layer; forming a photoresist fully-removed region, a photoresist partially-retained region and a photoresist fully-retained region by using one exposure and development process; wherein, the photoresist fully-removed region corresponds to the bonding zone, the photoresist partially-retained region corresponds to other areas than the bonding zone in the reset zone, and the photoresist fully-retained region corresponds to other areas than the reset zone; etching the passivation layer, the source/drain metal layer, the semiconductor active layer and the gate insulating layer that correspond to the photoresist fully-removed region; removing the photoresist at the photoresist partially-retained region by ashing, and etching the passivation layer, the source/drain metal layer and the semiconductor active layer that correspond to the photoresist partially-retained region; and stripping off the photoresist situated at the photoresist fully-retained region.

For example, in the case that the display substrate is an array substrate and in the case that an organic thin film layer is formed between a source/drain metal layer and a passivation layer, the forming the reset zone comprises: by using one patterning process, removing at least the passivation layer and the organic thin film layer provided in the reset zone.

BRIEF DESCRIPTION OF THE DRAWINGS

In order to illustrate the technical solution in the embodiments of the disclosure or prior art more clearly, the drawings needed to used in descriptions of the embodiments or prior art will be briefly introduced below; it is obvious that the drawings as described below are only related to some embodiments of the disclosure, for those ordinarily skilled in the art, other drawings can also be obtained from these drawings without any creative work.

Figure 1A:
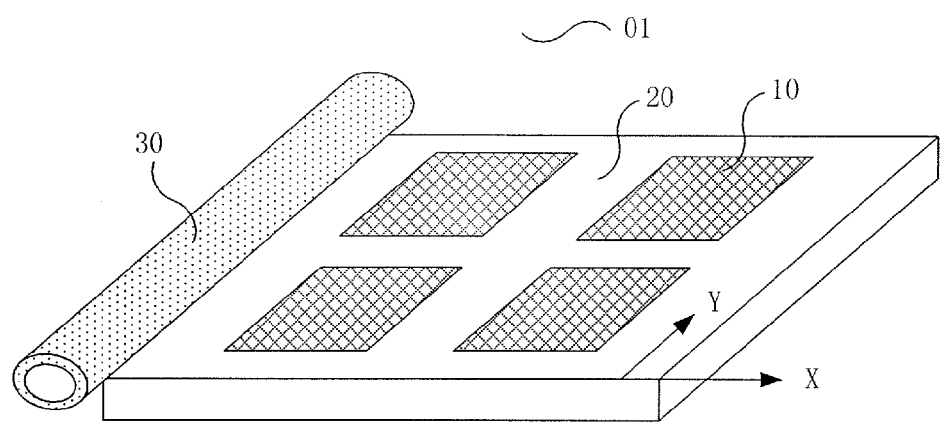
FIG. 1a is a structurally schematic view illustrating a display substrate according to embodiments of the disclosure.

Reference numerals:
01—display substrate; 02—base substrate; 03—counter substrate;
04—sealant; 05—liquid crystal layer; 06—array substrate;
07—display panel; 10—display region; 100—lead wire; 101—protective layer;
102—gate insulating layer; 103—semiconductor active layer;
104—source/drain metal layer; 105—passivation layer;
106—organic thin film layer; 20—non-display region; 201—reset zone;
30—rubbing roller; A—bonding zone;
X—rubbing direction of a display substrate;
Y—direction perpendicular to the rubbing direction of the display substrate;
300—photoresist; 301—fully-removed zone of the photoresist;
302—partially-retained zone of the photoresist;
303—fully-retained zone of the photoresist.

DESCRIPTION OF THE EMBODIMENTS

Hereinafter, the technical solutions in the embodiments of the disclosure will be described in a clearly and fully understandable way in connection with the drawings in the embodiments of the disclosure. It is obvious that the described embodiments are just a part but not all of the embodiments of the disclosure. Based on the embodiments in the disclosure, those ordinarily skilled in the art can obtain other embodiment(s), without any inventive work, which come(s) into the scope sought for protection by the disclosure.

Figure 1B:
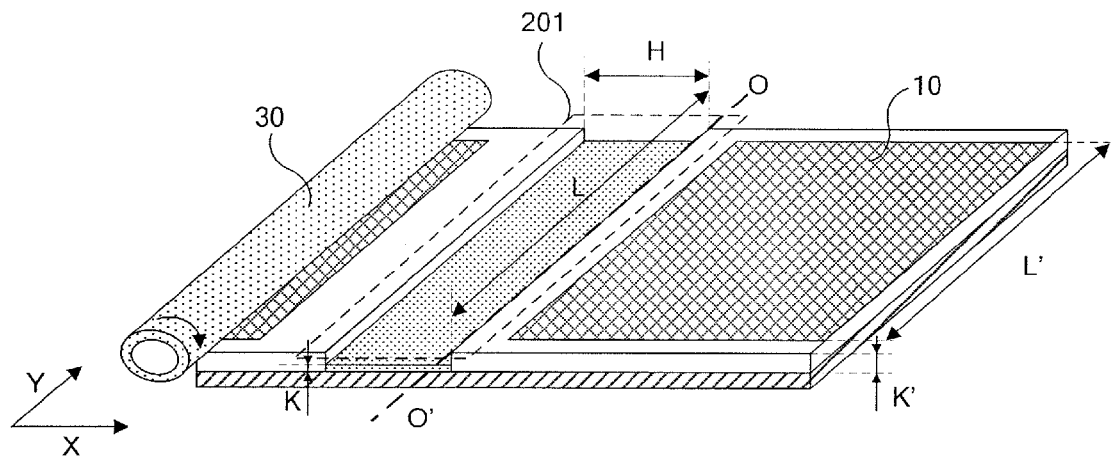
FIG. 1b is a structurally schematic view illustrating the display substrate provided with a reset zone according to the embodiments of the disclosure.

According to embodiments of the disclosure, there is provided a display substrate. As shown in FIG. 1a, the display substrate for example includes a display region 10 and a non-display region 20. As shown in FIG. 1b, a reset zone 201 for example is provided in the non-display region 20, and a thickness K of a thin film layer provided in the reset zone 201 is smaller than a thickness K' of a thin film layer provided in a zone adjacent to the reset zone 201. A step between the thin film layer in the reset zone 201 and the thin film layer in the zone adjacent to the reset zone 201 at the boundary (O-O') of the reset zone 201 and the zone adjacent to the reset zone 201 is uniform in height. As such, during rolling a rubbing roller in the rubbing process, a uniform force is applied on the rubbing cloth of the rubbing roller at the step of the above boundary (O-O'), and thus a uniform deformation of the rubbing cloth occurs.

It is to be noted that, the thin film layer provided in the reset zone 201 may be of a single layer structure, or may be of a multilayer structure. In the case that the thin film layer provided in the reset zone 201 is of the single layer structure, the thickness K of the thin film layer provided in the reset zone 201 is the distance from a surface of the single-layered thin film layer to a surface of a base substrate 02 (as shown in FIG. 2c) of the display substrate, namely, thickness of the single-layered thin film layer. In the case that the thin film layer provided in the reset zone 201 is of the multilayer structure, the thickness K of the thin film layer provided in the reset zone 201 is the distance from a surface of an uppermost thin film layer in the multilayered thin film layer to the surface of the base substrate 02 of the display substrate, namely, the total thickness of the multilayered thin film layer. In addition, the thickness K' of the thin film layer provided in the zone adjacent to the reset zone is determined in the similar way.

Further, in a Y-direction, a size L of the reset zone 201 is greater than or equal to a size L' of the display region; the direction Y is perpendicular to a rubbing direction X of the display substrate. In this way, the rubbing cloth with uniform deformation provided on the rubbing roller 30 fully covers the display region in the Y-direction. Thus, the flatness of a rubbing face of the rubbing cloth in contact with the display region 10 is enhanced, and alignment grooves formed on an alignment layer of the display region 10 are uniform in depth.

According to the embodiments of the disclosure, there is provided the display substrate, the display substrate includes the display region and the non-display region, and the reset zone is provided in the non-display region. On the one hand, the thickness of the thin film layer provided in the reset zone is smaller than the thickness of the thin film layer provided in the zone adjacent to the reset zone so that the step exists between the surface of the thin film layer of the reset zone and the surface of the thin film layer of the zone adjacent to the reset zone; further, the step between the surface of the thin film layer in the reset zone and the surface of the thin film layer in the zone adjacent to the reset zone at the boundary of the reset zone and the zone adjacent to the reset zone is uniform in height, so that in the case that the rubbing roller contacts the step at the above boundary during its rolling from the non-display region to the display region in the rubbing process, the uniform force is applied on the rubbing cloth of the rubbing roller at the above boundary and then uniform deformation of the rubbing cloth occurs. On the other hand, due to the fact that the size of the reset zone is greater than or equal to the size of the display region in the direction perpendicular to the rubbing direction of the display substrate, the rubbing cloth with uniform deformation provided on the rubbing roller fully covers the display region in the direction perpendicular to the rubbing direction of the display substrate, the flatness of the rubbing face of the rubbing cloth in contact with the display region is enhanced. Accordingly, alignment grooves formed on the alignment layer of the display region are uniform in depth, and Rubbing Mura with lump grayscale non-uniformity caused by the fact that alignment grooves are non-uniform in depth is avoided.

It is to be noted that, the above-mentioned display substrate 01 may be an array substrate, or may be a counter substrate disposed in opposition to the array substrate, such as a color filter substrate. The rubbing process is generally performed before a cutting process; therefore, as shown in FIG. 1a, the display substrate that has not been cut includes a plurality of display regions 10 and a plurality of non-display regions 20 that are alternately provided.

It is to be noted that, with respect to the zone adjacent to the reset zone 201, its position depends on the position of the reset zone 201. For example, in the case that the reset zone 201 is relatively far away from the display region 10, the zone adjacent to the reset zone is also situated in the non-display region. In the case that the reset zone 201 is immediately adjacent to the display region 10, the zone adjacent to the reset zone is the display region.

Next, with reference to an example in which the display substrate is the array substrate, the structure of the array substrate provided with the reset zone will be described in detail.

Embodiment 1

A plurality of pixel units that are defined by a plurality of gate lines and a plurality of data lines intersecting with each other are included in the display region 10 of the array substrate, and each of the pixel units includes a TFT and a pixel electrode. During display, a gate signal transmitting by the gate line turns on the TFT connected to the gate line; after that, a data signal is input to a source electrode of the TFT through the data line, and then the data signal is charged to the pixel electrode of the pixel unit through a drain electrode of the TFT. In this way, liquid crystal molecules corresponding to the pixel unit are rotated, so as to achieve different gray scales.

In order to input the above driving signals (for example, the gate signal and the data signal as described above) to the display region 10, it is generally required that a bonding zone A is provided in the non-display region 20 of the array substrate, so as to bond a driving IC capable of outputting the driving signals to the array substrate.

For example, during a bonding process, a lead wire 100 made of a metallic material is provided in the non-display region 20; one end of the lead wire 100 is connected to the gate line or the data line provided in the display region 20, and the other end of the lead wire 100 is connected to the driving IC at the bonding zone A. It is to be noted that, the lead wire 100 may be made of a metal for forming the gate line and formed simultaneous with the gate line; or may be made of a metal for forming the data line and formed simultaneously with the data line.

Figure 2A:
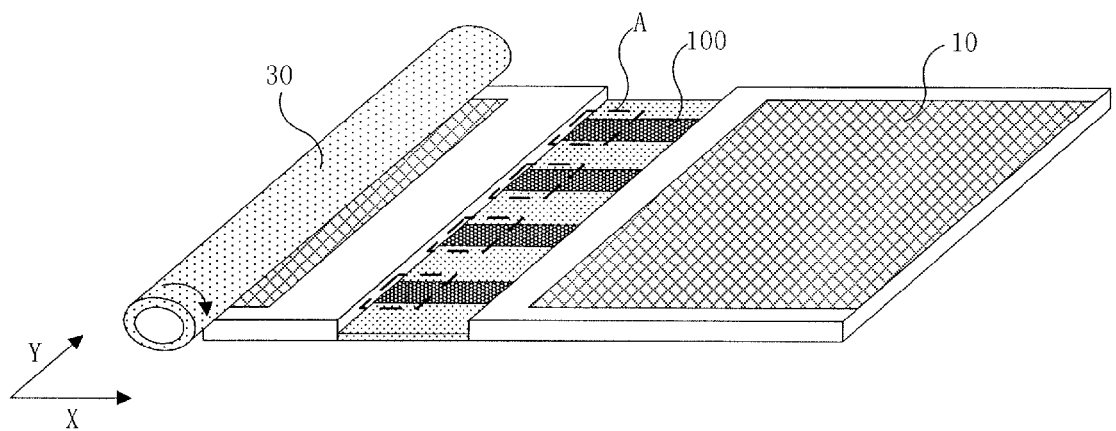
FIG. 2a is a structurally schematic view illustrating another display substrate provided with the reset zone according to the embodiments of the disclosure.

In the case that the above bonding zone is provided within the reset zone 201, in view of the fact that the thin film layer within the reset zone 201 is uniform in thickness, as shown in FIG. 2a, the thin film layer in the reset zone 201 needs to be flush with a surface of the lead wire 100, and the surface of the lead wire 100 is exposed so as to be connected to the driving IC.

However, after completion of the bonding process, a portion of the lead wire 100 provided outside the bonding zone A will be affected by external environment because the surface thereof is exposed, for example, the portion of the lead wire 100 provided outside the bonding zone A is oxidized or polluted. Thus, the disconnection and/or short-circuit of the driving circuit occurs, and display quality is adversely affected.

Figure 2B:
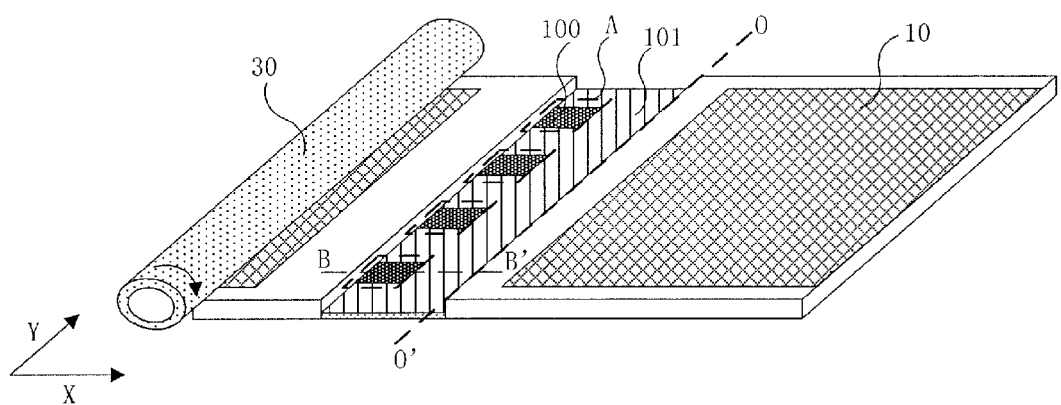
FIG. 2b is a structurally schematic view illustrating still another display substrate provided with the reset zone according to the embodiments of the disclosure.
Figure 2C:
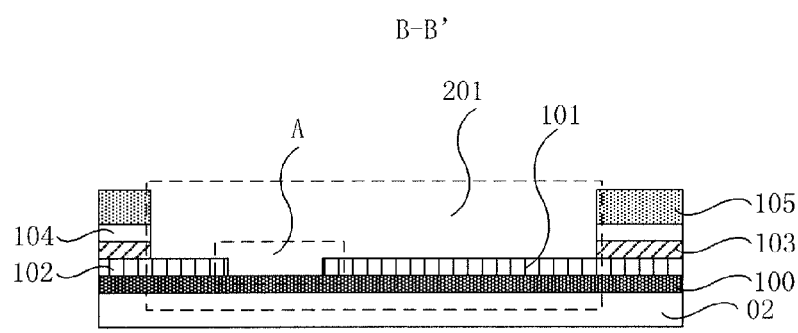
FIG. 2c is a sectional view illustrating the structure of the reset zone of the display substrate according to the embodiments of the disclosure.

In order to solve the above problem, a protective layer 101 is provided in the reset zone 201. As shown in FIG. 2b, the protective layer 101 covers the areas other than the bonding zone A. Thus, the portion of the lead wire 100 that is not connected with the driving IC is protected.

For example, the protective layer 101 may be produced after the production of the reset zone 201 is accomplished. For example, in the case that the lead wire 100 is formed in a same layer and with a same material as the gate line, all of the thin film layers (as shown in FIG. 2c, including a gate insulating layer 102, a semiconductor active layer 103, a source/drain metal layer 104, and a passivation layer 105) located on a side of the gate line away from the base substrate 02 in the reset zone 201 are removed. After that, in the reset zone 201, the protective layer 101 covering areas other than the bonding zone A is fabricated. The protective layer may be formed by a same material as the gate insulating layer 102.

For example, the protective layer 101 may be produced in the course of the production of the reset zone 201. For example, in the case that lead wire 100 is formed in the same layer and with the same material as the gate line, all of the thin film layers (e.g. including the semiconductor active layer 103, the source/drain metal layer 104, and the passivation layer 105) located on a side of the gate insulating layer 102 (the gate insulating layer 102 covers the gate line) away from the base substrate in the reset zone 201 are removed. Then, the gate insulating layer in the bonding zone is removed, so as to expose the portion of the lead wire 100 to be connected with the driving IC.

In the case that the protective layer is provided, there is a step with the thickness of the protective layer (i.e. the gate insulating layer 102 in FIG. 2c) between the bonding zone A and other areas than the bonding zone A. Because such step is relatively small in height, it will not cause an obvious non-uniform deformation of the rubbing cloth provided on the rubbing roller 30.

Furthermore, in the case that the lead wire 100 is formed in the same layer and with the same material as the gate line, owing to the fact that the gate line and the gate insulating layer are relatively close to the base substrate of the array substrate, the step with large and uniform height is provided at the boundary of the reset zone 201 and the zone adjacent to the reset zone after removing all of the thin film layers on the gate insulating layer during production of the reset zone 201. After the rubbing roller 30 passes the above bonding zone, the rubbing roller 30 passes the step at the boundary (O-O') of the reset zone 201 and the zone adjacent to the reset zone; and at this time, the step causes the rubbing cloth provided on the rubbing roller to undergo a larger and uniform deformation. Consequently, the case where the fabricated alignment grooves are non-uniform in depth owing to the non-uniform deformation of the rubbing cloth can be avoided.

Embodiment 2

For the sake of reducing the parasitic capacitance between the data line and the pixel electrode on the array substrate so as to improve the switching speed, an organic thin film layer 106 for example is produced in partial regions between the source/drain metal layer 104 and the passivation layer 105.

Figure 3:
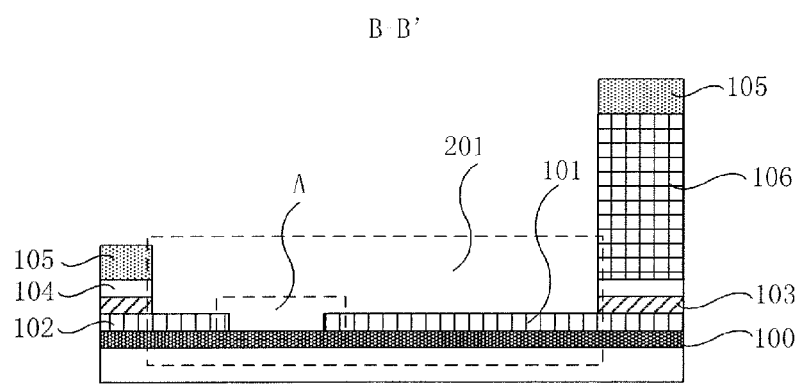
FIG. 3 is a sectional view illustrating another structure of the reset zone of the display substrate according to the embodiments of the disclosure.

Since the thickness of the organic thin film layer 106 is much larger than the thickness of the passivation layer 105, as shown in FIG. 3, the organic thin film layer 106 and the passivation layer 105 provided on the organic thin film layer 106 in the reset zone 201 are removed during production of the reset zone 201, so that the organic thin film layer 106 covers areas other than the reset zone 201. In this case, the step with uniform and very large height is provided at the boundary (O-O') of the reset zone 201 and the zone adjacent to the reset zone 201. In the case that the rubbing roller passes the above step before it enters the display region 10, the step causes the rubbing cloth provided on the rubbing roller to undergo a larger and uniform deformation. Consequently, the case where the fabricated alignment grooves are non-uniform in depth owing to the non-uniform deformation of the rubbing cloth can be avoided as well.

Embodiment 3

Figure 6:
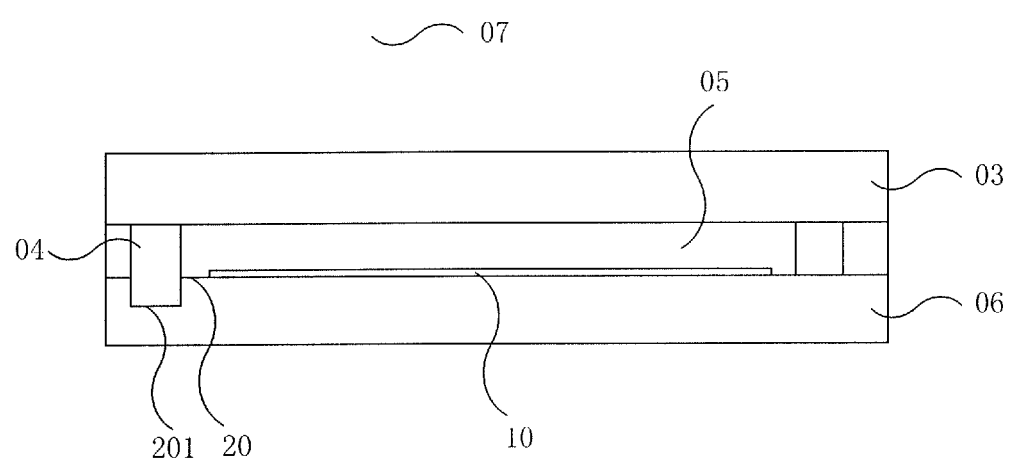
FIG. 6 is a schematic view illustrating a display panel according to the embodiments of the disclosure.

As shown in FIG. 6, a display panel 07 according to the embodiments of the disclosure is illustrated. For example, the display panel 07 includes any one of the display substrates as stated above. In the event that the display substrate 01 is the array substrate 06, the reset zone 201 for example corresponds to a position of a sealant 04 located on a surface of the array substrate 06. In this way, even though the lead wire 100 is exposed during production of the reset zone 201, the exposed lead wire 100 provided outside the bonding zone A is covered by the sealant in a subsequent procedure of producing the sealant, thereby the lead wire 100 is prevented from being adversely affected by the environment.

In FIG. 6, the display substrate 01 is the array substrate 06, and a counter substrate 03 provided in opposition to the array substrate may be a color filter substrate. For example, the color filter substrate also has the structure of any one of the display substrates as stated above. A liquid crystal layer is provided between the array substrate and the color filter substrate.

With respect to the display panel according to the embodiments of the disclosure, it has the same beneficial effects as the display substrate according to forgoing embodiments. Since the structure and beneficial effects of the display substrate have been described in detail in forgoing embodiments, details are omitted here.

According to the embodiments of the disclosure, there is provided a display device. For example, the display device includes the above-mentioned display panel. The display device has the same beneficial effects as the display substrate according to forgoing embodiments. Since the structure and beneficial effects of the display substrate have been described in detail in forgoing embodiments, details are omitted here.

It is to be noted that, in the embodiments of the disclosure, the display device may include a liquid crystal display device. For example, the display device may be a liquid crystal display, a liquid crystal television, a digital photo frame, a cell phone, a watch, a navigator, an electronic paper, a tablet computer or any other product or component having a display function.

Figure 4:
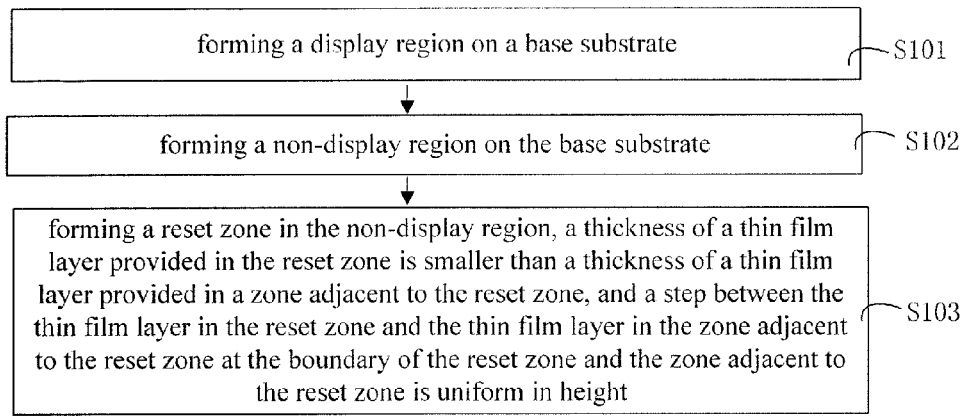
FIG. 4 is a flowchart illustrating a manufacturing method of a display substrate according to the embodiments of the disclosure.

According to the embodiments of the disclosure, there is provided a manufacturing method of a display substrate. As shown in FIG. 4, the method for example includes the following steps:

S101, a display region 10 is formed on a base substrate.

S102, a non-display region 20 is formed on the base substrate.

S103, a reset zone 201 is formed in the non-display region, and a thickness K of a thin film layer provided in the reset zone 201 is smaller than a thickness K' of a thin film layer provided in a zone adjacent to the reset zone 201.

A step between the thin film layer in the reset zone 201 and the thin film layer in the zone adjacent to the reset zone 201 at the boundary (O-O') of the reset zone 201 and the zone adjacent to the reset zone 201 is uniform in height. As such, during rolling a rubbing roller in the rubbing process, a uniform force is applied on the rubbing cloth of the rubbing roller at the step of the above boundary (O-O'), and thus a uniform deformation of the rubbing cloth occurs.

Further, in a Y-direction, a size L of the reset zone 201 is greater than or equal to a size L' of the display region; the direction Y is a direction within the surface of the display substrate and perpendicular to a rubbing direction X of the display substrate. In this way, the rubbing cloth with uniform deformation provided on the rubbing roller 30 fully covers the display region in the Y-direction. Thus, the flatness of a rubbing face of the rubbing cloth in contact with the display region 10 is enhanced, and alignment grooves formed on an alignment layer of the display region 10 are uniform in depth.

It is to be noted that, the above step S101 and the step S102 may be carried out simultaneously, and then the step S103 is carried out; or, the step S101, the step S102 and the step S103 may be carried out at the same time. The present disclosure does not set a limit to the sequence of the above steps.

Next, with reference to an example in which the display substrate is an array substrate, the manufacturing method of the display substrate provided with the reset zone will be described in detail.

Embodiment 4

In the case that a bonding zone is provided within the reset zone 201, in view of the fact that the thin film layer within the reset zone 201 is uniform in thickness, as shown in FIG. 2a, the thin film layer in the reset zone 201 needs to be flush with a surface of the lead wire 100, and the surface of the lead wire 100 is exposed so as to be connected to a driving IC.

However, after completion of the bonding process, a portion of the lead wire 100 provided outside the bonding zone A will be affected by external environment because the surface thereof is exposed, for example, the portion of the lead wire 100 provided outside the bonding zone A is oxidized or polluted. Thus, the disconnection and/or short-circuit of the driving circuit occurs, and display quality is adversely affected.

In order to solve the above problem, the manufacturing method of the display substrate for example includes forming a protective layer 101 in the areas other than the bonding region A in the reset zone 201. Thus, the portion of the lead wire 100 that is not connected with the driving IC is protected.

For example, the protective layer 101 may be produced after the production of the reset zone 201 is accomplished. For example, in the case that the lead wire 100 is formed in the same layer and with the same material as the gate line, all of the thin film layers (as shown in FIG. 2c, including a gate insulating layer 102, a semiconductor active layer 103, a source/drain metal layer 104, and a passivation layer 105) located on a side of the gate line away from the base substrate 02 in the reset zone 201 are removed. After that, in the reset zone 201, the protective layer 101 covering areas other than the bonding zone A is fabricated. The protective layer may be formed by the same material as the gate insulating layer 102.

For example, the protective layer 101 may be produced in the course of the production of the reset zone 201. For example, in the case that lead wire 100 is formed in the same layer and with the same material as the gate line, the manufacturing method is performed as below.

Figure 5A:
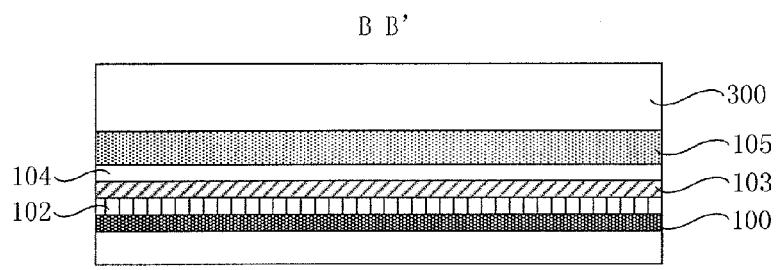
FIGS. 5a to 5d are structurally schematic views illustrating the display substrate during the manufacturing method thereof according to the embodiments of the disclosure.

Firstly, as shown in FIG. 5a, the gate insulating layer 102, the semiconductor active layer 103, the source/drain metal layer 104 and the passivation layer 105 are sequentially formed on a surface of the lead wire 100, and a photoresist 300 is coated on a surface of the passivation layer 105.

Figure 5B:
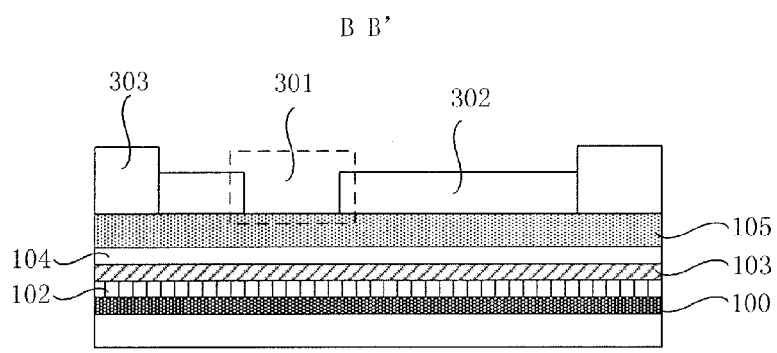

Then, as shown in FIG. 5b, with a dual-tone mask and by using one exposure and development process, a photoresist fully-removed region 301, a photoresist partially-retained region 302 and a photoresist fully-retained region 303 are formed.

The photoresist fully-removed region 301 corresponds to the bonding zone A, the photoresist partially-retained region 302 corresponds to the areas other than the bonding zone A in the reset zone 201, and the photoresist fully-retained region 303 corresponds to areas other than the reset zone 201.

Figure 5C:
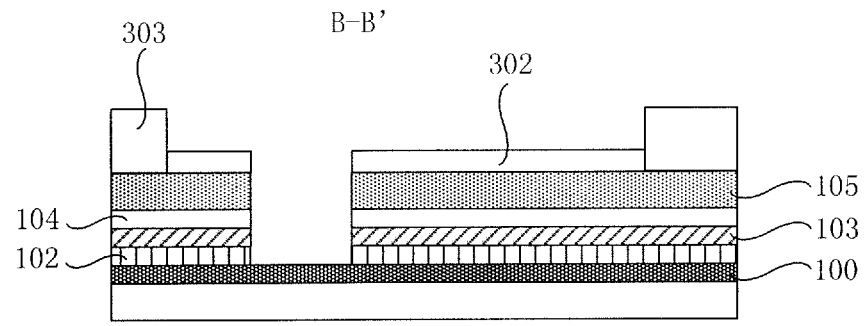

Next, as shown in FIG. 5c, the passivation layer 105, the source/drain metal layer 104, the semiconductor active layer 103 and the gate insulating layer 102 that correspond to the photoresist fully-removed region 301 are etched away.

Figure 5D:
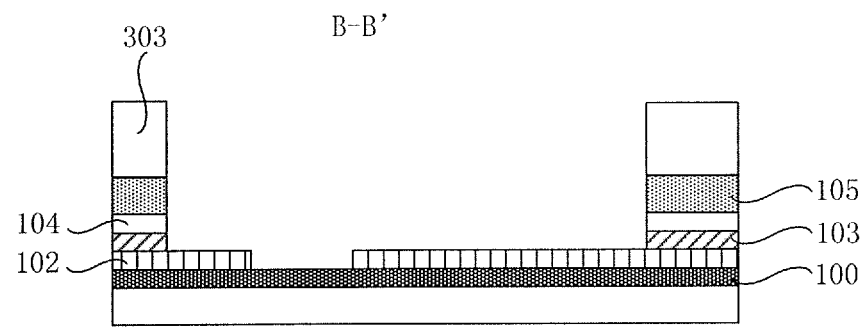

After that, as shown in FIG. 5d, the photoresist at the photoresist partially-retained region 302 is removed by ashing. Then, the passivation layer 105, the source/drain metal layer 104 and the semiconductor active layer 103 that correspond to the photoresist partially-retained region 302 are etched away. Thus, the areas other than the bonding zone A in the reset zone 201 is protected by the retained gate insulating layer 102. Therefore, the retained gate insulating layer 102 severs as the protective layer 101 to protect the portion of the lead wire 100 that is not connected with the driving IC.

Finally, the photoresist 300 situated in the photoresist fully-retained region 303 is stripped off, so as to form the structure shown in FIG. 2c.

In the case that the protective layer is provided, there is a step with the thickness of the protective layer (i.e. the gate insulating layer 102 in FIG. 2c) between the bonding zone A and other areas than the bonding zone A. Because such step is relatively small in height, it will not cause an obvious non-uniform deformation of the rubbing cloth provided on the rubbing roller 30.

Furthermore, in the case that the lead wire 100 is formed in the same layer and with the same material as the gate line, owing to the fact that the gate line and the gate insulating layer are relatively close to the base substrate of the array substrate, the step with large and uniform height is provided at the boundary of the reset zone 201 and the zone adjacent to the reset zone after removing all of the thin film layers on the gate insulating layer during production of the reset zone 201. After the rubbing roller 30 passes the above bonding zone, the rubbing roller 30 passes the step at the boundary (O-O') of the reset zone 201 and the zone adjacent to the reset zone; and at this time, the step causes the rubbing cloth provided on the rubbing roller to undergo a larger and uniform deformation. Consequently, the case where the fabricated alignment grooves are non-uniform in depth owing to the non-uniform deformation of the rubbing cloth can be avoided.

Embodiment 5

In the event that the display substrate 01 is the array substrate, for the sake of reducing the parasitic capacitance between the data line and the pixel electrode on the array substrate so as to improve the switching speed, an organic thin film layer 106 for example is produced in partial regions between the source/drain metal layer 104 and the passivation layer 105.

Hence, the reset zone 201 may be formed as follows.

By using one patterning process, at least the passivation layer 105 and the organic thin film layer 106 in the reset zone 201 are removed.

It is to be noted that, in the case that no bonding zone A is provided in the reset zone 201, the reset zone 201 is formed as follows. A photoresist 300 is coated on a surface of the passivation layer 105, and then a photoresist removed region corresponding to the location of the reset zone 201 and a photoresist retained region corresponding to other location than the reset zone 201 are formed by an exposure and development process with a single-tone mask. Next, at least the passivation layer 105 and the organic thin film layer 106 corresponding to the photoresist removed region are etched off. After that, the photoresist at the photoresist retained region is stripped, and the reset zone 201 is formed.

It is to be noted that, in the case that the bonding zone A is provided in the reset zone 201, as shown in FIG. 3, at the same time that at least the passivation layer 105 and the organic thin film layer 106 in the reset zone 201 are etched off, the gate insulating layer 103 at the bonding zone A also needs to be etched off. In this case, a dual-tone mask same as the dual-tone mask in Embodiment 4 is used, and photoresist regions having different thickness are formed after exposure and development. After that, the structure shown in FIG. 3 is formed by using etching, ashing and other process. Since the patterning process using the dual-tone mask has already been described in detail in forgoing embodiments, and its details are omitted here.

It is to be noted that, since the thickness of the organic thin film layer 106 is much larger than the thickness of the passivation layer 105, as shown in FIG. 3, the organic thin film layer 106 and the passivation layer 105 provided on the organic thin film layer 106 in the reset zone 201 are removed during production of the reset zone 201, so that the organic thin film layer 106 covers areas other than the reset zone 201. In this case, the step with uniform and very large height is provided at the boundary (O-O') of the reset zone 201 and the zone adjacent to the reset zone 201. In the case that the rubbing roller passes the above step before it enters the display region 10, the step causes the rubbing cloth provided on the rubbing roller to undergo a larger and uniform deformation. Consequently, the case where the fabricated alignment grooves are non-uniform in depth owing to the non-uniform deformation of the rubbing cloth can be avoided as well.

According to the embodiments of the disclosure, there are provided the display substrate, the manufacturing method thereof, the display panel and the display device. The display substrate includes the display region and the non-display region, and the reset zone is provided in the non-display region. On the one hand, the thickness of the thin film layer provided in the reset zone is smaller than the thickness of the thin film layer provided in the zone adjacent to the reset zone so that the step exists between the surface of the thin film layer of the reset zone and the surface of the thin film layer of the zone adjacent to the reset zone; further, the step between the surface of the thin film layer in the reset zone and the surface of the thin film layer in the zone adjacent to the reset zone at the boundary of the reset zone and the zone adjacent to the reset zone is uniform in height, so that in the case that the rubbing roller contacts the step at the above boundary during its rolling from the non-display region to the display region in the rubbing process, the uniform force is applied on the rubbing cloth of the rubbing roller at the above boundary and then uniform deformation of the rubbing cloth occurs. On the other hand, due to the fact that the size of the reset zone is greater than or equal to the size of the display region in the direction perpendicular to the rubbing direction of the display substrate, the rubbing cloth with uniform deformation provided on the rubbing roller fully covers the display region in the direction perpendicular to the rubbing direction of the display substrate, the flatness of the rubbing face of the rubbing cloth in contact with the display region is enhanced. Accordingly, alignment grooves formed on the alignment layer of the display region are uniform in depth, and Rubbing Mura with lump grayscale non-uniformity caused by the fact that alignment grooves are non-uniform in depth is avoided.

Descriptions made above are merely specific embodiments of the disclosure, but the protection scope of the disclosure is not limited thereto. Changes or replacements, as easily conceivable by those skilled in the art within the technical scope disclosed by the disclosure, shall be encompassed within the protection scope of the disclosure. Therefore, the protection scope of the disclosure shall be determined by the protection scope of attached claims.

This application claims the benefit of priority from Chinese patent application No. 201410650620.X, filed on Nov. 14, 2014, the disclosure of which is incorporated herein in its entirety by reference as a part of the present application.

What is claimed is:

1. A display substrate, comprising a display region and a non-display region, wherein,
   a reset zone is provided in the non-display region, and a thickness of a thin film layer provided in the reset zone is smaller than a thickness of a thin film layer provided in a zone adjacent to the reset zone;
   a step between the thin film layer in the reset zone and the thin film layer in the zone adjacent to the reset zone at the boundary of the reset zone and the zone adjacent to the reset zone is uniform in height;
   in a direction within a surface of the display substrate and perpendicular to a rubbing direction of the display substrate, a size of the reset zone is greater than or equal to a size of the display region; and
   the display substrate is an array substrate, a bonding zone is provided within the reset zone, a protective layer is provided within the reset zone, and the protective layer covers other areas than the bonding zone in the reset zone with exposing a lead wire made of a metallic material within the bonding zone.

2. The display substrate according to claim 1, wherein, in the case that the lead wire of the bonding zone is formed in a same layer and with a same material as a gate line of the display region, the protective layer comprises a gate insulating layer.

3. The display substrate according to claim 1, wherein, in the case that an organic thin film layer is provided on a surface of a source/drain metal layer of the array substrate, the organic thin film layer covers other areas than the reset zone.

4. The display substrate according to claim 1, wherein, the reset zone corresponds to a location of a sealant located on a surface of the array substrate.

5. A display panel, comprising the display substrate according to claim 1.

6. A display device, comprising the display panel according to claim 5.

7. A manufacturing method of a display substrate, comprising:
   forming a display region on a base substrate; and
   forming a non-display region on the base substrate; wherein,
   a reset zone is formed in the non-display region, a thickness of a thin film layer provided in the reset zone is smaller than a thickness of a thin film layer provided in a zone adjacent to the reset zone;
   a step between the thin film layer in the reset zone and the thin film layer in the zone adjacent to the reset zone at the boundary of the reset zone and the zone adjacent to the reset zone is uniform in height;
   in a direction within a surface of the display substrate and perpendicular to a rubbing direction of the display substrate, a size of the reset zone is greater than or equal to a size of the display region; and
   the display substrate is an array substrate, a bonding zone is provided within the reset zone, a protective layer is provided within the reset zone, and the protective layer covers other areas than the bonding zone in the reset zone with exposing a lead wire made of a metallic material within the bonding zone.

8. The manufacturing method of the display substrate according to claim 7, wherein, the method comprises:
   forming the protective layer in areas other than the bonding zone in the reset zone.

9. The manufacturing method of the display substrate according to claim 7, wherein, in the case that the lead wire of the bonding zone is formed in a same layer and with a same material as a gate line of the display region, the method comprises:
   sequentially forming a gate insulating layer, a semiconductor active layer, a source/drain metal layer and a passivation layer on a surface of the lead wire, and coating a photoresist on a surface of the passivation layer;

forming a photoresist fully-removed region, a photoresist partially-retained region and a photoresist fully-retained region by using one exposure and development process; wherein, the photoresist fully-removed region corresponds to the bonding zone, the photoresist partially-retained region corresponds to other areas than the bonding zone in the reset zone, and the photoresist fully-retained region corresponds to other areas than the reset zone;

etching the passivation layer, the source/drain metal layer, the semiconductor active layer and the gate insulating layer that correspond to the photoresist fully-removed region;

removing the photoresist at the photoresist partially-retained region by ashing, and etching the passivation layer, the source/drain metal layer and the semiconductor active layer that correspond to the photoresist partially-retained region; and stripping off the photoresist situated at the photoresist fully-retained region.

10. The manufacturing method of the display substrate according to claim 7, wherein, in the case that an organic thin film layer is formed between a source/drain metal layer and a passivation layer, the forming the reset zone comprises:

by using one patterning process, removing at least the passivation layer and the organic thin film layer provided in the reset zone.

11. The display substrate according to claim 2, wherein, in the case that an organic thin film layer is provided on a surface of a source/drain metal layer of the array substrate, the organic thin film layer covers other areas than the reset zone.

12. The display substrate according to claim 2, wherein, the reset zone corresponds to a location of a sealant located on a surface of the array substrate.

13. The display substrate according to claim 3, wherein, the reset zone corresponds to a location of a sealant located on a surface of the array substrate.

14. The manufacturing method of the display substrate according to claim 8, wherein, in the case that the lead wire of the bonding zone is formed in a same layer and with a same material as a gate line of the display region, the method comprises:

sequentially forming a gate insulating layer, a semiconductor active layer, a source/drain metal layer and a passivation layer on a surface of the lead wire, and coating a photoresist on a surface of the passivation layer;

forming a photoresist fully-removed region, a photoresist partially-retained region and a photoresist fully-retained region by using one exposure and development process; wherein, the photoresist fully-removed region corresponds to the bonding zone, the photoresist partially-retained region corresponds to other areas than the bonding zone in the reset zone, and the photoresist fully-retained region corresponds to other areas than the reset zone;

etching the passivation layer, the source/drain metal layer, the semiconductor active layer and the gate insulating layer that correspond to the photoresist fully-removed region;

removing the photoresist at the photoresist partially-retained region by ashing, and etching the passivation layer, the source/drain metal layer and the semiconductor active layer that correspond to the photoresist partially-retained region; and stripping off the photoresist situated at the photoresist fully-retained region.

15. The manufacturing method of the display substrate according to claim 8, wherein, in the case that an organic thin film layer is formed between a source/drain metal layer and a passivation layer, the forming the reset zone comprises:

by using one patterning process, removing at least the passivation layer and the organic thin film layer provided in the reset zone.

16. The manufacturing method of the display substrate according to claim 9, wherein, in the case that an organic thin film layer is formed between a source/drain metal layer and a passivation layer, the forming the reset zone comprises:

by using one patterning process, removing at least the passivation layer and the organic thin film layer provided in the reset zone.

* * * * *